(12) United States Patent
Linkowsky et al.

(10) Patent No.: US 6,717,391 B2
(45) Date of Patent: Apr. 6, 2004

(54) LITHIUM-ION CELL VOLTAGE TELEMETRY CIRCUIT

(75) Inventors: Frank Andrew Linkowsky, Middlesex, NJ (US); WojCiech Jaklik, Somerset, NJ (US); Robert John Secor, Richboro, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/046,699

(22) Filed: Jan. 17, 2002

(65) Prior Publication Data

US 2003/0189421 A1 Oct. 9, 2003

(51) Int. Cl.⁷ .................. G01R 31/02; G01N 27/416
(52) U.S. Cl. ............................ 324/72; 324/434
(58) Field of Search .................. 324/72, 434

(56) References Cited

U.S. PATENT DOCUMENTS

| | | | | |
|---|---|---|---|---|
| 3,796,947 A | * | 3/1974 | Harrod et al. | 324/501 |
| 5,499,176 A | * | 3/1996 | Erisman | 363/21.01 |
| 5,948,105 A | * | 9/1999 | Skurnik et al. | 324/207.12 |
| 6,043,629 A | * | 3/2000 | Ashley et al. | 320/119 |
| 6,077,624 A | | 6/2000 | Mitchell et al. | 429/217 |
| 6,140,927 A | * | 10/2000 | Whitmire | 324/433 |
| 6,157,171 A | | 12/2000 | Smith | 320/133 |
| 6,211,650 B1 | | 4/2001 | Mumaw et al. | 320/122 |
| 6,281,684 B1 | * | 8/2001 | James | 324/434 |
| 6,456,511 B1 | * | 9/2002 | Wong | 363/21.13 |

* cited by examiner

Primary Examiner—N. Le
Assistant Examiner—Timothy J. Dole
(74) Attorney, Agent, or Firm—Townsend and Townsend and Crew LLP

(57) ABSTRACT

A battery is a collection of cells place in series, parallel, or both. A telemetry circuit is presented for determining the individual voltage of each cell making up a battery. This device uses a high voltage isolation circuit to isolate each cell from the remainder of the measuring circuitry. This is to ensure precision cell voltage measurements are made even at high common-mode voltages. This is an inherent problem for high voltage battery telemetry designs.

29 Claims, 11 Drawing Sheets

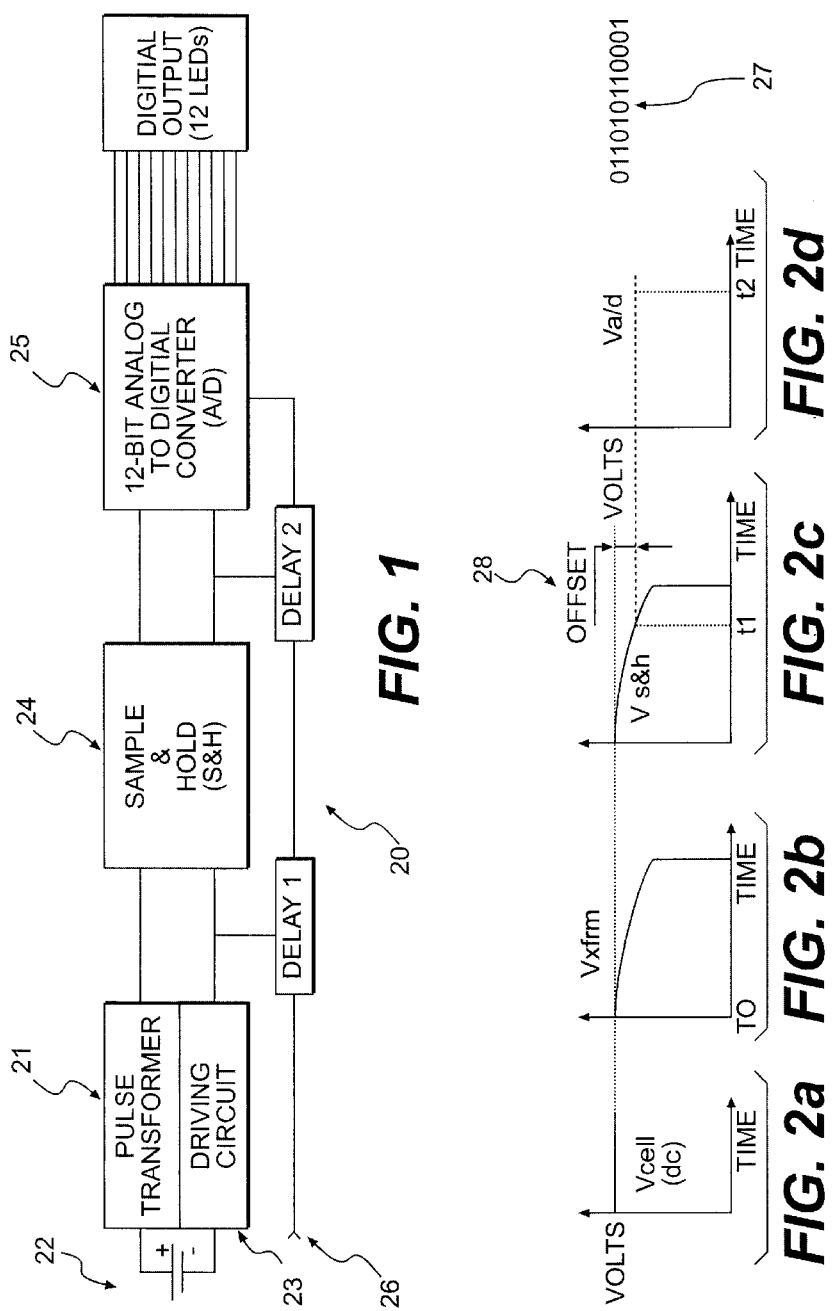

LITHIUM-ION CELL VOLTAGE TELEMETRY CIRCUIT

BACKGROUND OF THE INVENTION

1. Field of the Invention

The present invention relates to voltage sensing and measuring, and more specifically, to an apparatus for sensing and measuring voltage with greater precision. The apparatus uses an isolation circuit to isolate the signal provided by a voltage source, such as a lithium-ion cell, from the remainder of the measuring circuit to ensure precision measurement even at high voltage levels.

2. Description of the Related Art

Lithium-ion cells are being used in greater numbers of space applications, such as to power satellite electronics and control systems. Accurate sensing of the state of the charge of these cells is very critical for lowering system mass and increasing battery life. Typically, the state of charge of a lithium-ion battery can be derived from the voltage of each cell. Therefore, voltage telemetry precision is of utmost importance. The more components used in the circuit, means more tolerance that must be accounted for in a worst case accuracy analysis.

U.S. Pat. No. 6,211,650 to Mumaw describes a method of limiting the charging voltage applied to an individual cell of a plurality of cells making up a battery in which the actual voltage of an individual cell has been sensed. However, this patent does not suggest a use for precision measurements of voltage by means of an isolation circuit. In addition, this patent does not suggest an attempt to reduce the measurement error through a minimal number of elements.

U.S. Pat. 6,157,171 to Smith describes a method for monitoring the voltage of a rechargeable battery using an integrated circuit. This patent does not suggest the use of a circuit, such as a transformer, to isolate the cell from the rest of the circuit. Furthermore, there is no suggestion that an emphasis has been placed on precision and accuracy of the measurements.

U.S. Pat. 6,077,624 to Mitchell describes the general operation of a lithium-ion battery. The patent suggests an improved method to improve the thermal stability of a lithium-ion cell. While the detailed components and operation of this type of cell are described in the patent, there is no description of a voltage sensing device that employs an isolation circuit.

A continuing need exists for improved circuitry for measuring voltage levels on a precision and accuracy basis.

SUMMARY OF THE INVENTION

An object of the present invention is to provide a voltage telemetry circuit which uses a "minimal" circuit approach to sampling cell voltage.

Another object of the present invention is to provide a voltage telemetry circuit that minimizes errors related to component tolerances, and allows the voltage to be determined repeatedly and predictably.

A further object of the invention is to provide a method for isolating the input signal to the isolation circuit from the measurement circuitry.

The present invention meets these objectives by providing an isolation circuit that isolates a cell from measurement circuitry. Preferably, the invention provides an output voltage that is the same as the input voltage applied to the isolation circuit. An approximation of an ideal isolation circuit provides an output that differs from the input of the isolation circuit by a predictable amount. One such circuit is a pulse transformer. The output of a pulse transformer includes a predictable and repeatable offset from the input.

Other and further objects of the present invention will be apparent from the following description and claims and are illustrated in the accompanying drawings, which by way of illustration, show preferred embodiments of the present invention. Other embodiments of the invention embodying the same or equivalent principles may be used and structural changes may be made as desired by those skilled in art without departing from the present invention and the purview of the appended claims.

BRIEF DESCRIPTION OF THE DRAWINGS

FIG. 1 is a block diagram of an exemplary system embodying the present invention.

FIGS. 2a–2d are graphic displays of the magnitude of the voltage at various points in the FIG. 1 circuit.

DETAILED DESCRIPTION OF THE PREFERRED EMBODIMENTS

Figure 3:
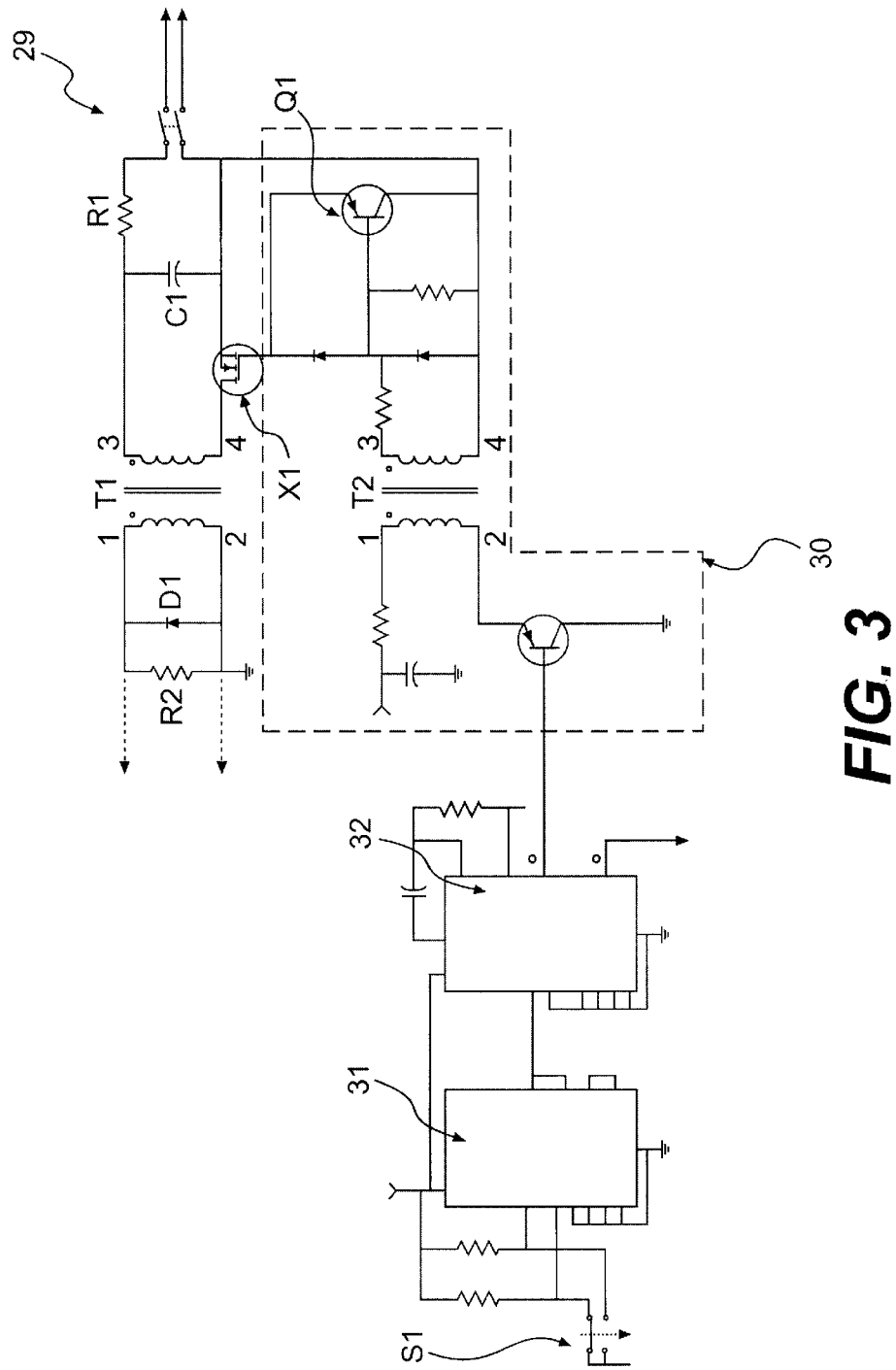
FIG. 3 is a schematic diagram of an exemplary pulse transformer, driving circuit and enable circuit.

FIG. 1 is a block diagram of an exemplary system embodying the present invention. A signal detection circuit 20 measures and/or senses the voltage of a voltage source 22, such as a lithium-ion cell. This exemplary embodiment includes a pulse transformer 21 to which a driving circuit 23 is operatively connected. The FIG. 1 embodiment also includes a sample and hold circuit 24 operatively connected to the pulse transformer 21. An enable signal 26 enables the driving circuit 23. The pulse transformer 21 is then switched on by the driving circuit 23. A 12-bit analog-to-digital converter 25 is operatively connected to the sample and hold circuit 24. The sample and hold circuitry may not be a separate circuit element. For example, it may be part of the analog-to-digital conversion, which conversion may be implemented, for example, by a dedicated circuit or by software. The output of the analog-to-digital converter 25 can be connected to any desired circuitry, such as a display and/or subsequent processing circuitry.

FIGS. 2a–2d are graphic displays of the magnitude of the voltage at various points in the FIG. 1 circuit. FIG. 2a shows the output dc voltage of the voltage source 22 in FIG. 1 with respect to time. For the time period shown, it is assumed to be constant. So, it is represented by a straight horizontal line. FIG. 2b is a graph showing the output of the pulse transformer 21, $V_{xfrm}$. As seen in FIG. 2b, the magnitude of the signal decreases by a known amount. FIG. 2c graphically illustrates the voltage at the output of the sample and hold 24 shown in FIG. 1. The voltage magnitude at the sample and hold circuit 24 differs from the input magnitude of the voltage source 22 by a known amount called the offset 28. The analog-to-digital converter 25 converts the output of the sample and hold 24 to a digital word 27.

FIG. 3 is a schematic diagram of an exemplary pulse transformer, driving circuit, and enable circuit. In this exemplary embodiment shown in FIG. 3, cell 22 shown in FIG. 1 connects to the circuit at the on/off switch 29. The input capacitor C1 is constantly charged to the cell's DC voltage level through resistor R1. The cell voltage changes very slowly. When switch X1 is turned on briefly (e.g., about 10 uS), the output waveform shown in FIG. 2b is generated across output resistor R2. A diode D1 protects the input of the sample and hold circuit 24 from the negative voltage of transformer T1. In the preferred embodiment, transformer T1 has a 1:1 ratio in order to match the cell voltage 22 to the input range of the sample and hold 24 and analog-to-digital converter 25.

Transformer T2 is used to drive switch X1. Transistor Q1 is used to quickly discharge switch X1, thereby insuring that the cell voltage from source 22 is only sampled for the intended duration. In this exemplary embodiment, chip 31 debounces switch S1 and creates a signal with a positive edge. Chip 32 recieves the debounced signal from chip 31 and creates a pulse output with a short duration, for example, of 14 uS. A driving circuit 30 is triggered by this pulse output, the pulse is also applied to the sample and hold 24 and analog-to-digital converter 25. Upon being activated, the driving circuit 30 turns on switch X1, allowing transformer T1 to sample the input voltage. Of course, the exemplary embodiment described can be altered for various applications.

Figure 4:
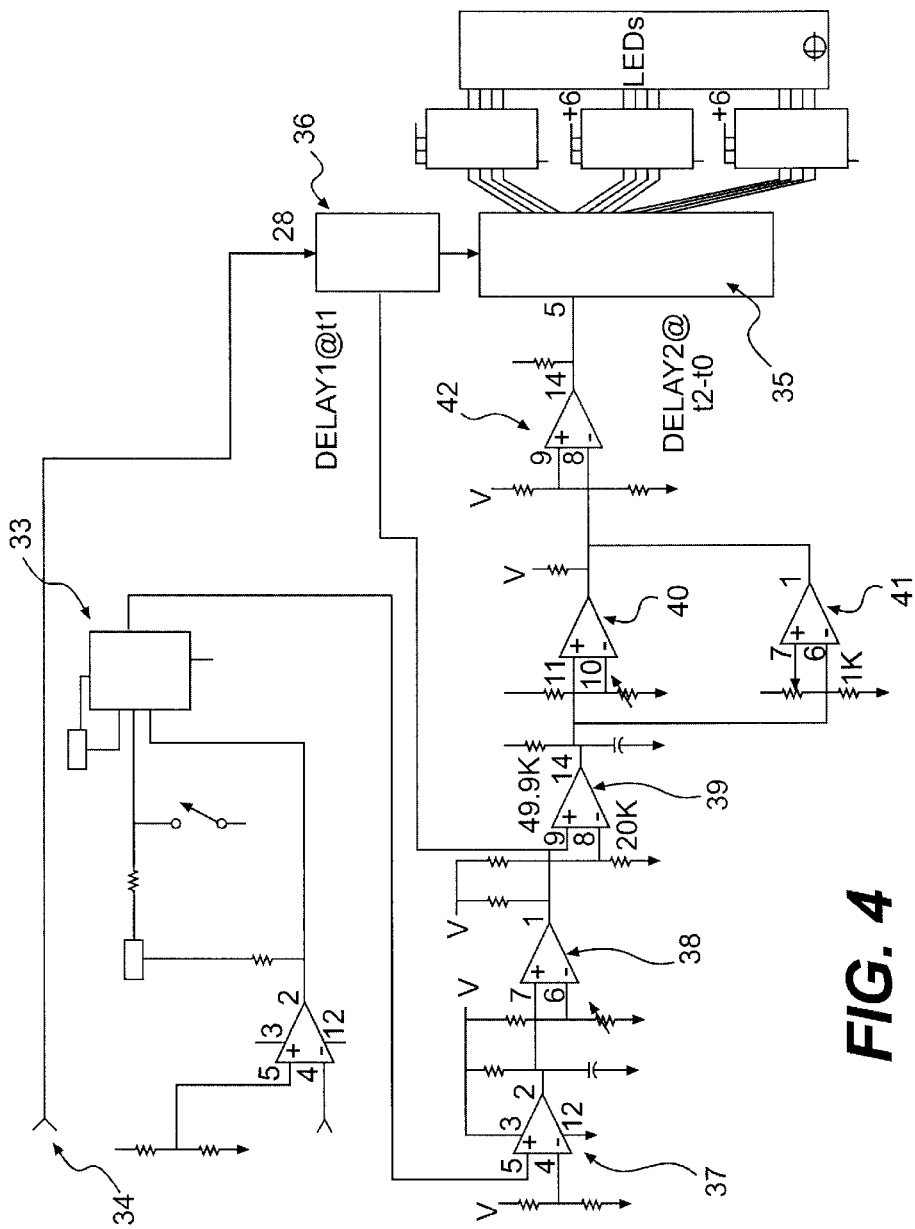
FIG. 4 is a schematic diagram of a sample and hold and analog-to-digital converter.

FIG. 4 is a schematic diagram of an exemplary sample and hold 24 and analog-to-digital converter 25. In this embodiment, the enable signal clocks the flip-flop 33. The output of flip-flop 33 drives delayed controls for the sample and hold 24 and analog-to-digital converter 25. Flip-flop 33 is reset after each measurement. In general, comparators 37 and 38 provide delay 1 at time t1 (FIG. 1). The output of these two comparators is applied to the sample and hold circuit 36. It is also applied to comparators 39, 40, 41, and 42, which provide delay 2 at time t2 (FIG. 2d). The output of comparator 42 is applied to the analog-to-digital converter 35. Of course, any desired method can be used to provide the delays and should be adjusted according to the specific application.

The output of transformer T1 is applied to the input of the sample and hold 36 shown in FIG. 4 on signal line 34. At time t1, this signal is sampled and held. At time t2, the analog-to-digital conversion takes place. The output of the analog-to-digital converter 35 can be applied to any desired computational or display circuitry.

Figure 5:
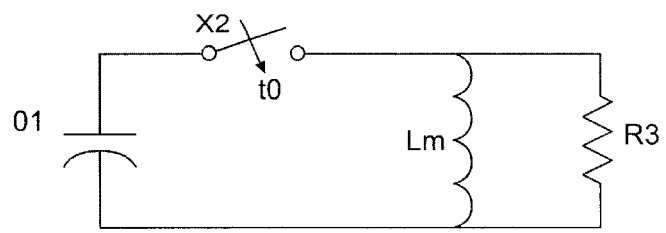
FIG. 5 is a schematic diagram of a simplified pulse transformer model.

FIG. 5 is a schematic diagram of a simplified pulse transformer model. The FIG. 5 circuit models the pulse transformer as a parallel RLC circuit. Since the transformer T1 shown in FIG. 3 has a 1:1 ratio, it is modeled using only its magnetizing inductance Lm. The approximation assumes that switch X2 is an ideal switch. The input voltage is the voltage from cell 22 of FIG. 1. At time $t_0$, switch X2 is briefly closed. Ideally the voltage across resistor R3 will have a waveform such as shown in FIG. 2b.

Figure 6:
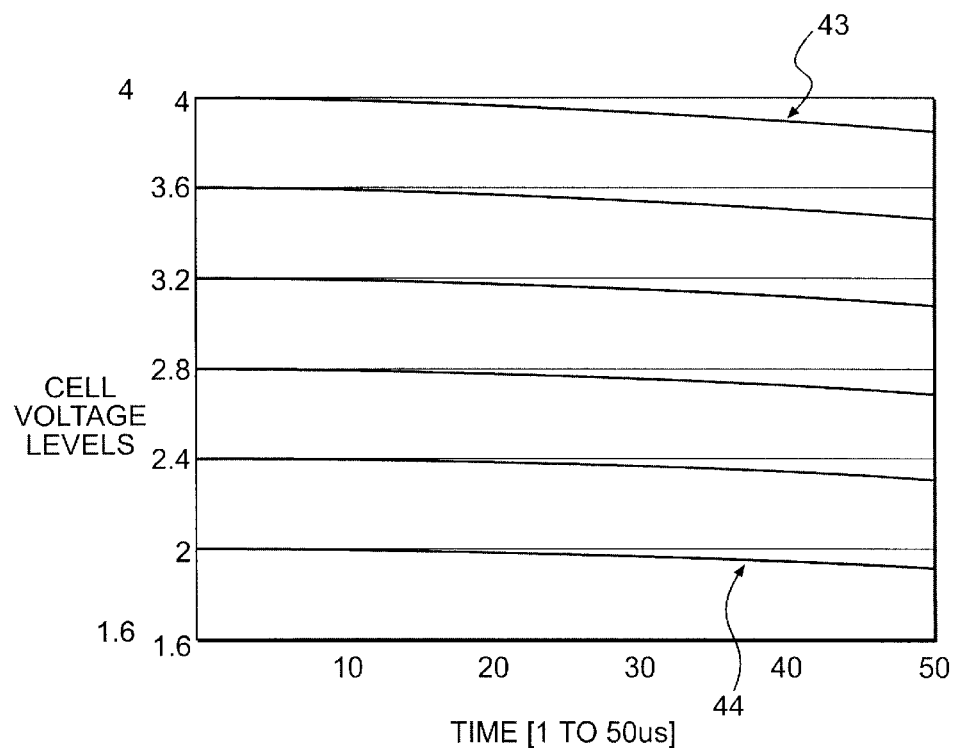
FIG. 6 is a graph showing voltage offsets of a pulse transformer at different voltage levels over a period of time.

FIG. 6 is a graph showing voltage offsets of a pulse transformer at different voltage levels over a period of time. The graph represents a cell discharge over a period of time when six measurements are taken. From examining waveform 43 and 44, a noticeable trend is apparent. The lower the initial voltage of the cell, the smaller the offset voltage. The drop changes linearly with the cell voltage.

Figure 7:
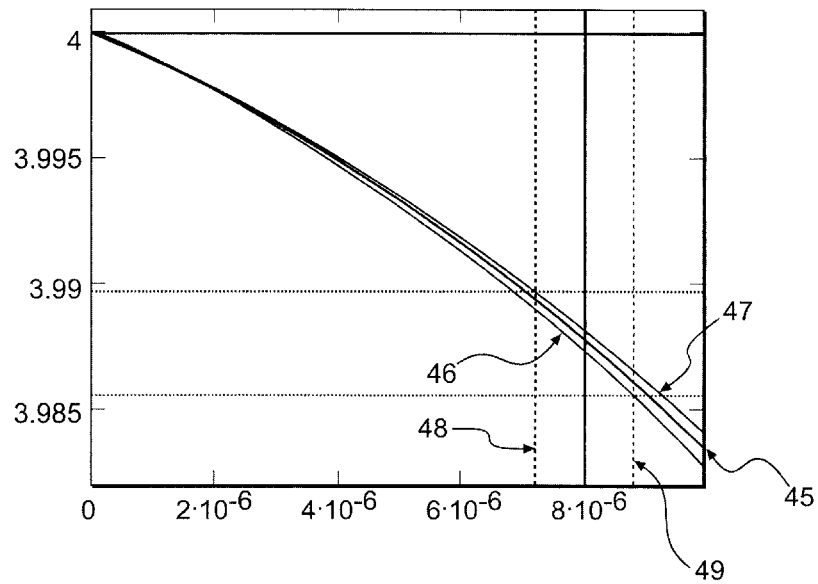
FIG. 7 is a graph showing the highest voltage level from FIG. 6.

FIG. 7 is a graph showing the highest voltage level from FIG. 6. The horizontal axis represents time measured in seconds and the vertical axis represents voltage measured in volts. If the cell 22 is at 4 volts, the $V_{xfrm}$ signal 2b has its maximum offset. The black solid line 45 represents the theoretical drop for nominal values of R3 and Lm (FIG. 5), at time t1 where the sample and hold 24 takes place. If for example, the cell voltage is sampled at t1=8 us the measured voltage has a value of 3.998V. The repeatable maximum offset at this voltage (4V) is 12.2 mV. However, this measurement may have errors due to changes in R3 and Lm (FIG. 5) as well as the timing t1. Assuming variations of R3 and Lm to be +/−10%, the transformer voltage may be at its minimum value shown by line 46, or its maximum value shown by line 47. Also, a timing error (e.g., +/−10%) shown by lines 48 and 49 may contribute to the overall error band. So at its extremes, the measurement could take place where line 48 intercepts waveform 47—the maximum offset minus error, or when line 49 intercepts waveform 46—the maximum offset plus error. The offset minus error in this case equals about 10 mV, and the offset plus error equals about 14 mV.

Figure 8:
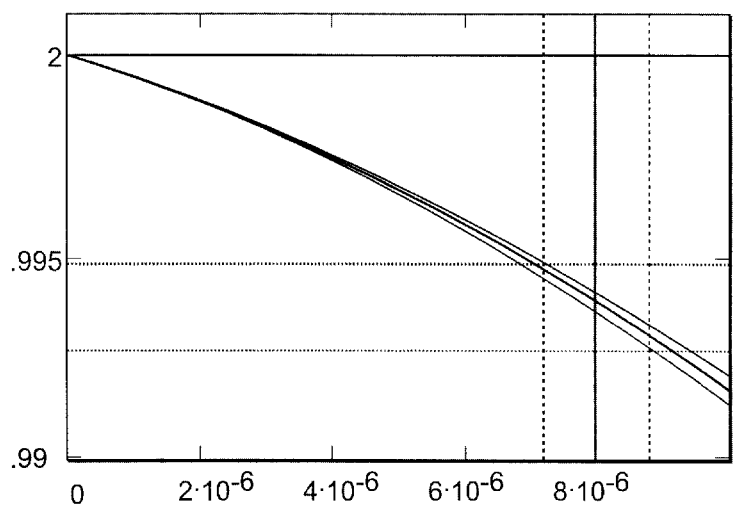
FIG. 8 is a graph showing the lowest voltage level from FIG. 6.

FIG. 8 is a graph showing the lowest voltage level from FIG. 6. The axes are the same as in FIG. 7. The noticeable differences from FIG. 7 are the initial cell voltage of 2V and the lower offset, which is approximately half the offset of the 4V signal in FIG. 7. By analyzing FIG. 8 in the same manner as FIG. 7, the repeatable minimum offset is calculated to be approximately 6 mV. The minimum offset minus error is approximately 5 mV, and the minimum offset plus error is approximately 7 mV.

Figure 9:
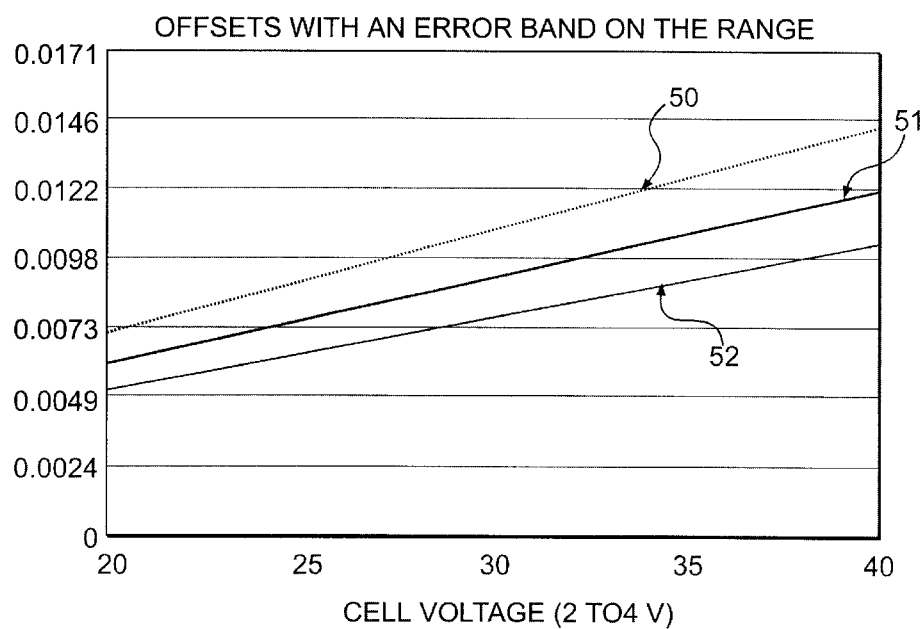
FIG. 9 is a graph showing the minimum and maximum offsets, with errors accounted for, over the entire cell voltage range.

FIG. 9 is a graph showing the minimum and maximum offsets, with errors accounted for, over the entire cell voltage range. The cell voltage ranging from 2 to 4 volts is shown on the horizontal axis, and the offset measured in millivolts is shown on the vertical axis. The maximum and minimum offsets accounting for error were calculated from an analysis of FIGS. 7 and 8. The offset varies linearly with the cell voltage, so by obtaining the offsets at a cell voltage of 2V and 4V, a line representing the entire spectrum of cell voltages can be constructed. In the worst case scenario, the offsets plus error were calculated to be between 7 and 14 mV (line 50). The offset without any error was calculated to be between 6 and 12 mV (line 51). Finally, the offset minus error was calculated to be between 5 and 10 mV (line 52).

Figure 10:
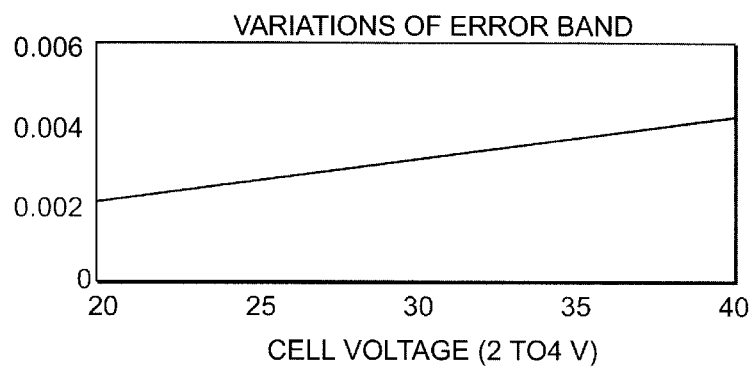
FIG. 10 is a graph showing variations in an error band at time t1.

FIG. 10 is a graph showing the variations in the error band at time t1 (FIG. 2c). The horizontal axis represents cell voltage measured in volts and the vertical axis represents voltage measured in millivolts. In the analysis of FIG. 8, the minimum offset minus error was calculated to be 5 mV. The minimum offset plus error was calculated to be 7 mV. This means there is a possible 2 mV error if the cell voltage is 2V. Similar analysis of FIG. 7 shows the error to be between 10 mV and 14 mV. This means there is a possible error of 4 mV when the cell 24 is at 4V. FIG. 10 results when the error at each of the two cell voltages (2V and 4V) are plotted and connected by a straight line.

Figure 11:
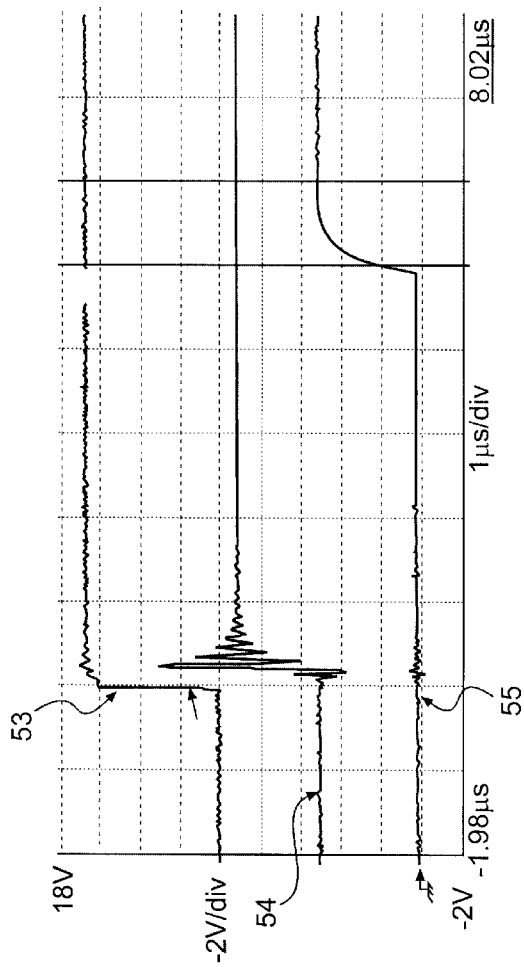
FIG. 11 is a graph showing signals generated at different points in the circuit.

FIG. 11 is a graph showing the signals generated at different points in the circuit. Time is shown on the horizontal axis. The enable signal 53 triggers the driving circuit 23 to produce the transformer output voltage 54. Small distortions can be seen at the positive edge of waveform 53 and 54. To eliminate the possibility of these errors being sampled, the sample and hold 55 takes place after a significant delay. In this exemplary model, the sample and hold 55 takes place 5 uS after the positive edges of the enable 53 and $V_{xfrm}$ 54. By delaying the sample and hold 55, the possibility of any errors being sampled is reduced to zero.

Figure 12:
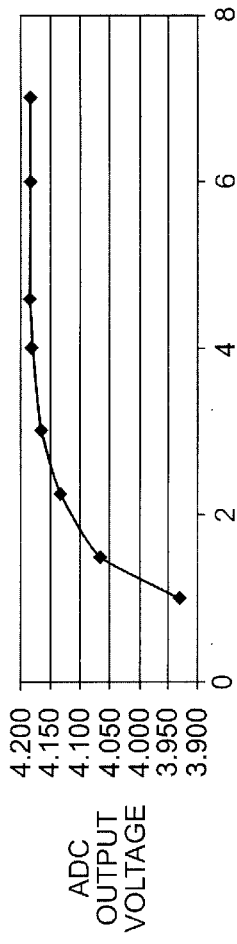
FIG. 12 is a graph showing sampling inaccuracy caused by insufficient delay time.
Figure 13:
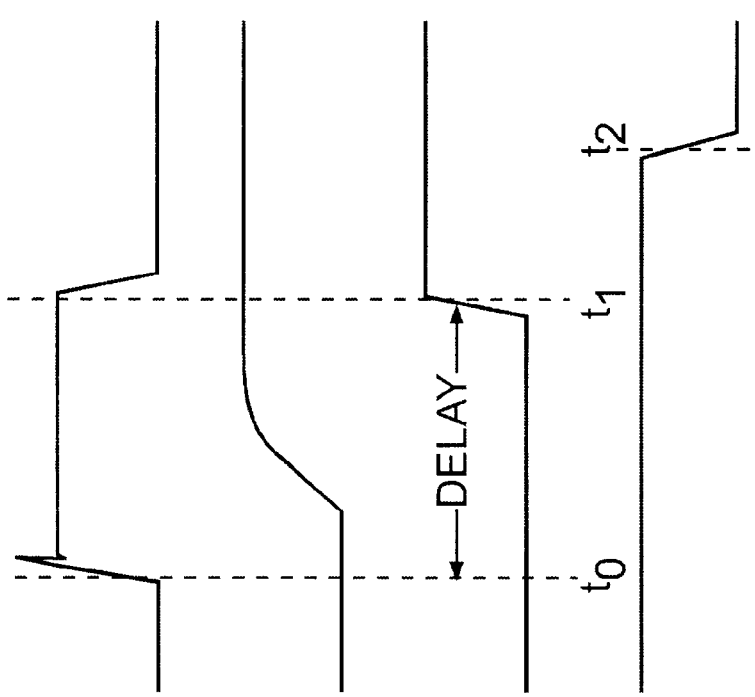
FIG. 13 is a graph showing timing of events that occur in an exemplary circuit in further detail.

FIG. 12 is a graph showing the sampling inaccuracy caused by insufficient delay time between the rising edge of the $V_{xfrm}$ pulse 54 and the rising edge of the sample and hold pulse 55. This delay was varied between 1 uS and 7 uS. FIG. 13 shows that sampling of the input voltage should occur using a delay of approximately 5 uS. This sampling time will allow enough time for a correct sampling of the cell voltage without causing an unnecessarily long delay. This delay is, however, dependent upon the circuitry used and would be adjusted for various applications.

FIGS. 13a–13d are graphs showing the timing of events in further detail. FIG. 13a shows the pulse transformer output that is applied to the sample and hold 24. The sample and hold 24 output is shown in FIG. 13b. To improve sampling accuracy, a delay is inserted between an input voltage, such as the transformer activation at $t_0$, and any hold commands (t1). FIG. 13c shows an example of one such delay. In this example, logic low samples the input, and logic high holds the value. Once the sampling operation is completed, the analog-to-digital conversion begins at t2, shown in FIG. 13d.

Figure 14:
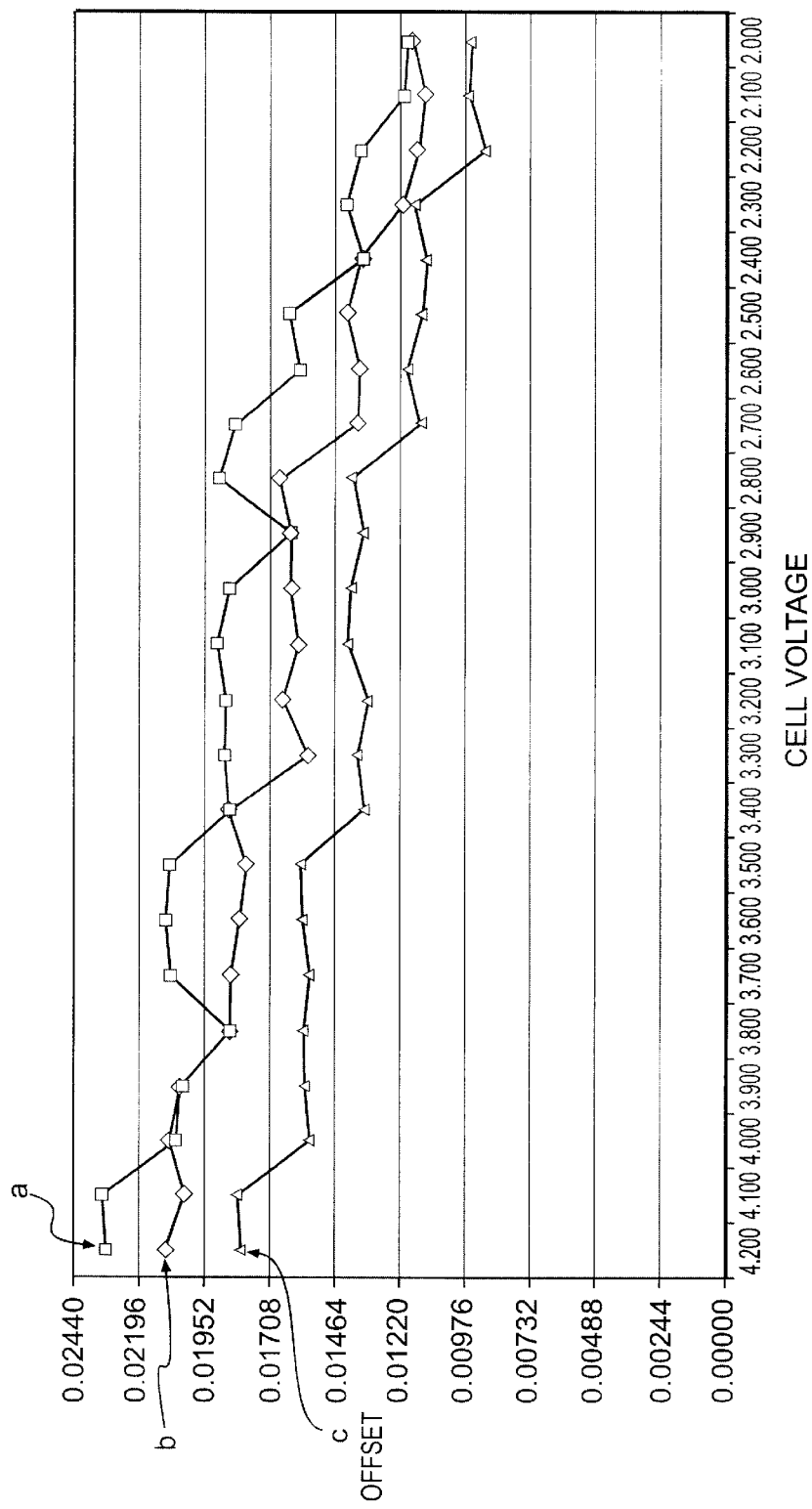
FIG. 14 is a graph showing changes in the transformer offset voltage due to temperature change.

FIG. 14 is a graph showing the change in transformer offset voltage due to temperature change. Cell voltage measured in volts is shown on the horizontal axis, and offset in volts is shown on the vertical axis. Every cell voltage measurement shown in this figure was executed five times to ensure accuracy. If the least significant bit was between resolution levels, the result was not used. Using a 12-bit A/D with 10V input range gives a resolution of 2.4414 mV. FIG. 14a shows the offset voltage of transformer T1 (FIG. 3) at 83.6 degrees C. FIG. 14b shows the offset voltage at 24.8 degrees C. Finally, FIG. 14c shows the offset voltage at –2.3 degrees C.

Figure 15:
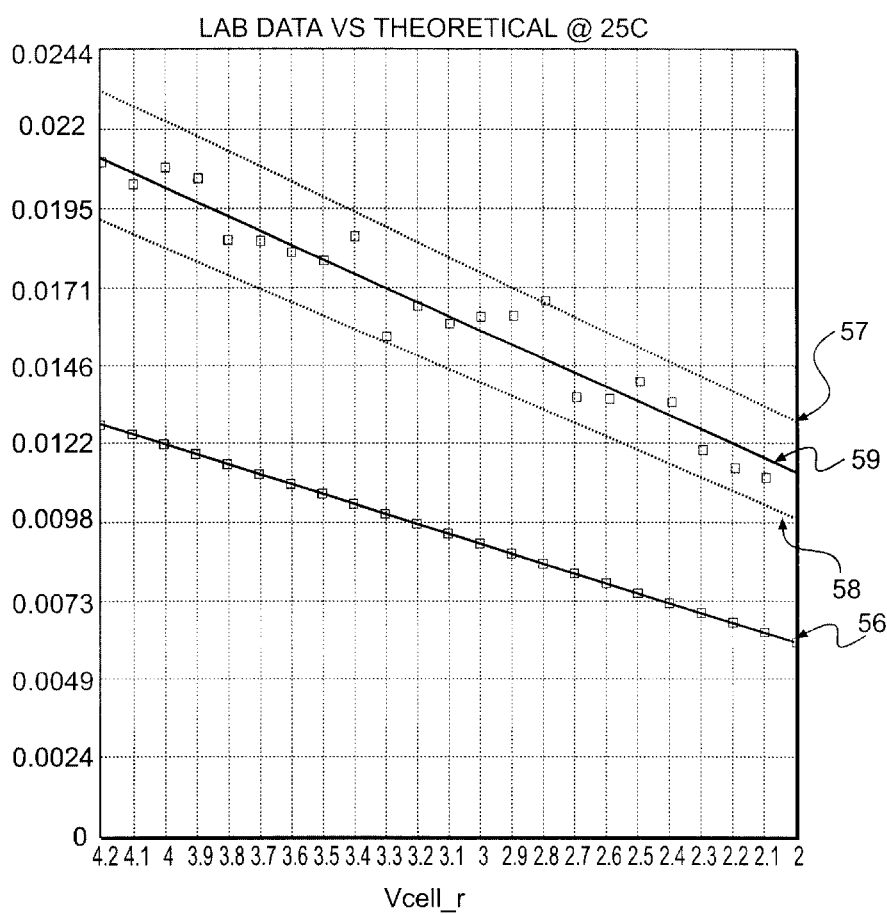
FIG. 15 is a graph showing offsets measured in the lab at room temperature compared to the theoretical offset.

FIG. 15 is a graph comparing the offset measured in the lab at room temperature to the theoretical offset. The figure shows offsets measured at a time when the sample and hold 24 takes place. Cell voltage is shown on the horizontal axis and offset is shown on the vertical axis. Both are measured in volts. The theoretical offset was calculated using a computer simulation and analysis of the RLC circuit (FIG. 5). The lab offset 59 is approximately 6.5 millivolts greater on average than the theoretical band 56, but it is repeatable and included within an error band bounded by line 57 and 58. The 6.5 mV difference can be explained by considering four facts that the theoretical calculation does not account for. First, theoretical calculations do not account for the parasitics of the various circuit components. Also unaccounted for in the theoretical analyses are common ground errors, errors contributed by the sample and hold and A/D, and measurement errors that occur in a laboratory setting.

Figure 16:
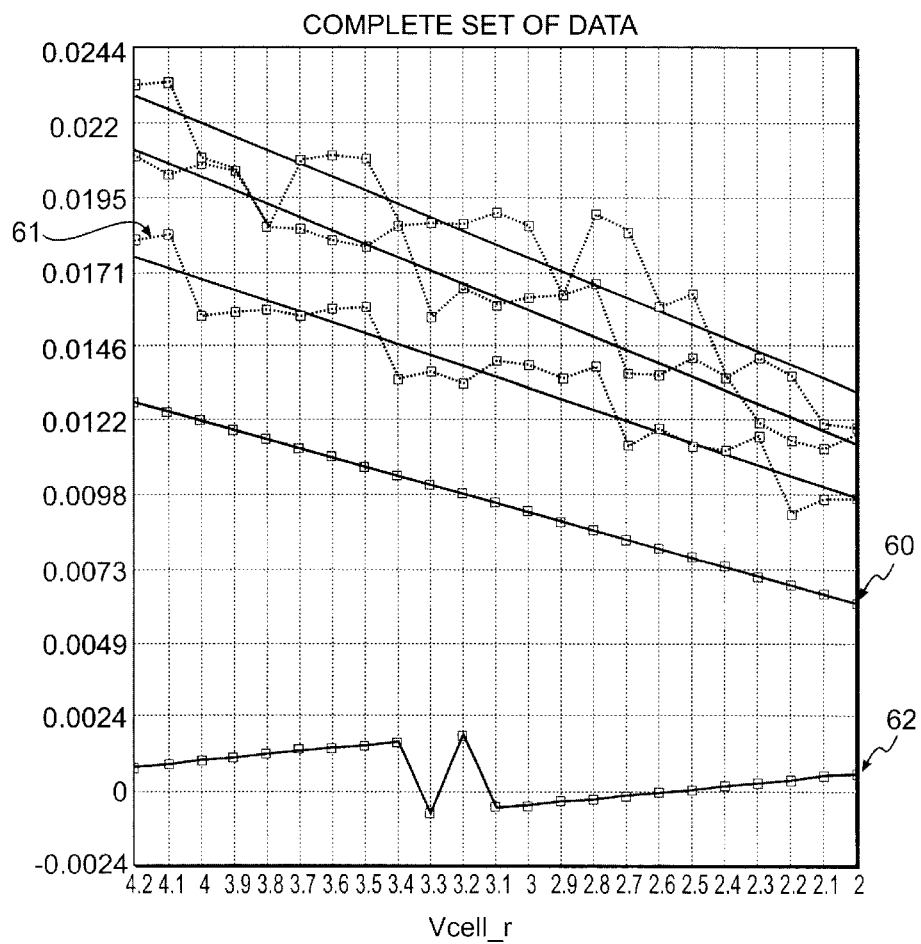
FIG. 16 is a graph showing offsets at different temperatures compared to the theoretical offset.

FIG. 16 is a graph showing the offset at different temperatures compared to the theoretical offset. Due to the temperature change, the offset varies on average +/–least significant bit =2.44 mV, and follows a staircase shape, which can best be seen on the cold data line 61. The bottom line 62, which is around zero voltage, represents the error contributed by the sample and hold and A/D at room temperature. To acquire these experimental readings, the pulse transformer circuit 21 is bypassed, and the cell voltage is applied directly to the input of the sample and hold 24.

The designed voltage telemetry circuit performed well in laboratory testing. The lab results confirm the theoretical predictions and meet the maximum measurement error requirement of 0.5%. The lab data shows the error to be less than 0.25% for all measurements taken. Each measurement generated a repeatable voltage offset, whose average can be easily predicted. Because the theoretical calculations are based on a very simplified pulse transformer model (FIG. 5), the lab results do not follow the calculated lines exactly. The measured voltage drop over the entire cell range is about 6 mV higher on average than the theoretical line. Using a more detailed modeling of the pulse transformer would bring the theoretical and laboratory lines closer together.

Although the invention has been described with reference to particular embodiments, it will be understood to those skilled in the art that the invention is capable of a variety of alternative embodiments within the spirit of the appended claims.

What is claimed is:

1. A spacecraft battery measuring and telemetry device for measuring a voltage from a spacecraft DC battery source and transmitting the measured voltage to processing circuitry, comprising:
   an isolation circuit operatively connectable to receive the voltage from the spacecraft DC battery source;
   a driving circuit operatively connected to the isolation circuit to initiate a signal to output the voltage associated from the spacecraft DC battery source;
   sampling circuitry operatively connected to the isolation circuit to obtain a voltage reading representative of the voltage; and
   a telemetry circuit adapted to receive and process the measured voltage.

2. The device according to claim 1, wherein said isolation circuit comprises a pulse transformer coupled between the DC battery source and the sampling circuitry.

3. The device according to claim 1, further comprising an enable circuit operatively connected to activate said driving circuit.

4. The device according to claim 1, wherein said sampling circuitry comprises a sample and hold circuit.

5. The device according to claim 4, further comprising an analog-to-digital converter operatively connected to said sample and hold circuitry and adapted to convert the analog voltage into a digital signal.

6. The device according to claim 5, further comprising a delay circuit operatively connected to said sample and hold circuit and said analog-to-digital converter.

7. The device according to claim 6, wherein said enable circuit is operatively connected to activate said delay circuit.

8. The device according to claim 6, wherein said delay circuit delays operation of said sample and hold circuit by a predetermined amount of time after operation of said isolation circuit.

9. The device according to claim 6, wherein said delay circuit delays operation of said analog-to-digital converter by a predetermined amount of time after operation of said sample and hold circuit.

10. The device according to claim 4, wherein said sample and hold circuit is operatively connected to provide an output that reflects the output of said isolation circuit.

11. The device of claim 1 wherein the DC battery source is a lithium ion battery.

12. The device as recited in claim 1, wherein the telemetry circuit comprises a display for displaying the measure voltage.

13. The device as recited in claim 1, wherein the telemetry circuit comprises a circuit for transmitting the voltage to a voltage monitoring location.

14. The device as recited in claim 13, wherein the voltage monitoring location is a ground station.

15. The device as recited in claim 13, wherein the voltage monitoring location is a system on the spacecraft.

16. An apparatus for measuring DC voltage from a lithium ion battery source on a spacecraft, the apparatus comprising:
    a spacecraft DC voltage source comprising a lithium ion battery;
    a pulse transformer having a first pair of connections and a second pair of connections, the first pair of connections being coupled to the spacecraft DC voltage source;
    a drive circuit coupled to the spacecraft DC voltage source and the pulse transformer and adapted to cause the pulse transformer to sample a voltage from the DC voltage source for a predetermined period of time;
    a sample and hold circuit coupled to the pulse transformer through the second pair of connections, the sample and hold circuit being adapted to receive and sample a voltage from the pulse transformer, the voltage being indicative of the spacecraft DC voltage source voltage; and
    a telemetry circuit adapted to receive and process the measured spacecraft DC voltage source voltage.

17. The apparatus of claim 16, further comprising a capacitor coupled between the pulse transformer and the voltage source, the capacitor being charged to a voltage representative of the source voltage.

18. The apparatus of claim 16, further comprising converter being coupled to the sample and hold circuit, the converter being adapted to convert the measured DC voltage source voltage from an analog signal to a digital signal.

19. The apparatus of claim 16, wherein the pulse transformer isolates the DC voltage source from the sample and hold circuit provides complete DC isolation.

20. The apparatus as recited in claim 16, wherein the drive circuit is coupled to the DC voltage source and the pulse transformer via a switch, and wherein when the switch is closed, the drive circuit causes the pulse transformer to sample the DC voltage source voltage.

21. The apparatus as recited in claim 20, further comprising a request circuit, the request circuit being coupled to the drive circuit and adapted to initiate the drive circuit, which in turn, causes the switch to close.

22. The apparatus, as recited in claim 16, wherein the telemetry circuit comprises a display for displaying the measure voltage.

23. The apparatus as recited in claim 16, wherein the telemetry circuit comprises a circuit for transmitting the voltage to a voltage monitoring location.

24. The apparatus as recited in claim 23, wherein the voltage monitoring location is a ground station.

25. The apparatus as recited in claim 23, wherein the voltage monitoring location is a system on the spacecraft.

26. The apparatus as recited in claim 16, wherein the predetermined period of time comprises a time period from time T0 to time TN, and wherein the apparatus further comprising a delay circuit adapted to cause the sample and hold circuit to sample the voltage at a time T1 after time T0.

27. The apparatus as recited in claim 26, wherein the measured voltage at time T1 is lower than the voltage at T0 by an offset voltage, and wherein the offset voltage is taken into account when determining the DC voltage source voltage.

28. The apparatus as recited in claim 27, wherein the offset voltage is lower for lower DC voltage source voltages.

29. The apparatus as recited in claim 16, wherein the telemetry circuit comprises a display for displaying the measure voltage.

* * * * *